(12) United States Patent
Meinerzhagen et al.

(10) Patent No.: US 10,784,865 B1
(45) Date of Patent: Sep. 22, 2020

(54) MINIMUM DELAY ERROR DETECTION AND CORRECTION FOR PULSED LATCHES

(71) Applicant: Intel Corporation, Santa Clara, CA (US)

(72) Inventors: Pascal Meinerzhagen, Hillsboro, OR (US); Vivek De, Beaverton, OR (US); Muhammad Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/413,110

(22) Filed: May 15, 2019

(51) Int. Cl.
*H03K 19/003* (2006.01)
*H03K 5/14* (2014.01)
*G06F 1/10* (2006.01)
*H03K 5/135* (2006.01)

(52) U.S. Cl.
CPC ......... *H03K 19/00323* (2013.01); *G06F 1/10* (2013.01); *H03K 5/135* (2013.01); *H03K 5/14* (2013.01)

(58) Field of Classification Search
CPC .. H03K 19/00323; H03K 5/133; H03K 5/134; H03K 5/131; H03K 5/14; H03K 5/19; G06F 1/08; G06F 1/10
See application file for complete search history.

(56) References Cited

U.S. PATENT DOCUMENTS

| | | | | |
|---|---|---|---|---|
| 6,229,360 B1 * | 5/2001 | Mizuno | .................... | G06F 1/10 327/141 |
| 6,242,954 B1 | 6/2001 | Taniguchi et al. | | |
| 6,608,513 B2 * | 8/2003 | Tschanz | ................. | H03K 3/012 327/166 |
| 6,873,187 B1 * | 3/2005 | Andrews | ................... | G06F 1/10 326/37 |
| 7,486,126 B2 * | 2/2009 | Shimazaki | ................ | G06F 1/10 327/293 |
| 7,701,255 B2 * | 4/2010 | Cortadella | ............ | H03K 19/20 326/93 |
| 7,795,938 B2 * | 9/2010 | Uchida | ................... | H03K 3/017 327/172 |
| 7,872,512 B2 * | 1/2011 | Lewis | .................. | H03K 3/0375 327/202 |
| 8,115,530 B2 | 2/2012 | Lewis et al. | | |
| 8,253,463 B1 | 8/2012 | Chromczak et al. | | |
| 8,427,213 B2 | 4/2013 | Lewis et al. | | |
| 8,471,612 B1 * | 6/2013 | Bull | ..................... | H03K 3/0375 327/147 |

(Continued)

OTHER PUBLICATIONS

Dhong et al "A 0.42V Vccmin ASIC-compatible pulse-latch solution as a replacement for a traditional master-slave flip-flop in a digital SOC" Published 2014 in Proceedings of the IEEE, Sep. 2014 Custom Integrated pp. 1-4, San Jose CA. USA.

(Continued)

*Primary Examiner* — Thomas J. Hiltunen
(74) *Attorney, Agent, or Firm* — International IP Law Group, P.L.L.C.

(57) ABSTRACT

A minimum delay error apparatus such as a minimum delay error detection, prediction, correction, repair, prevention, and/or avoidance apparatus includes a minimum delay path replica circuit. The minimum delay path replica circuit can detect or predict, and subsequently can correct or avoid, minimum delay errors in data paths of digital circuits using pulsed latches.

25 Claims, 7 Drawing Sheets

(56) References Cited

U.S. PATENT DOCUMENTS

| | | | |
|---|---|---|---|
| 8,710,891 B2* | 4/2014 | Lee | H03K 5/135 |
| | | | 327/172 |
| 9,520,877 B2 | 12/2016 | Meinerzahgen et al. | |
| 9,577,615 B1* | 2/2017 | Ganusov | G06F 1/10 |
| 9,584,305 B2* | 2/2017 | Yang | |
| 9,746,877 B2* | 8/2017 | Zhou | G06F 1/08 |
| 9,941,867 B1* | 4/2018 | Weber | H03K 3/012 |
| 2002/0186087 A1 | 12/2002 | Kim et al. | |

OTHER PUBLICATIONS

Mahoney, et al. "Clock distribution on a dual-core, multi-threaded Itanium®family processor" Digest of Technical Papers International Solid-State Circuits Conference Mar. 2005.

\* cited by examiner

300

400

500

MINIMUM DELAY ERROR DETECTION AND CORRECTION FOR PULSED LATCHES

TECHNICAL FIELD

This disclosure relates to minimum delay error detection and/or minimum delay error correction. For example, this disclosure relates to minimum delay error detection and/or minimum delay error correction for pulsed latches.

BACKGROUND

Maximum delay (max-delay) failures (or errors) and minimum delay (min-delay) failures (or errors) can occur in digital integrated circuits. In a normal data pipeline, data typically moves one stage per clock cycle. However, speed paths can occur, and minimum delay failures can also occur when data races through the pipeline and data consistency can be lost (which is a type of failure). Many techniques may be implemented that focus on maximum delay, or long critical timing paths, and it can be important to increase a maximum operating frequency. Timing errors such as maximum timing errors may be corrected if they appear, allowing the reduction of guard bands and faster operation.

In products such as central processing unit (CPU) and graphics processing unit (GPU) products, for example, clocking power can be responsible for a dominant power share (up to 50% of the power share, for example). Replacing single-edged triggered flip flops with pulsed latches allows for a reduction of total clocking power.

BRIEF DESCRIPTION OF THE DRAWINGS

The following detailed description may be better understood by referencing the accompanying drawings, which contain specific examples of numerous features of the disclosed subject matter.

In some cases, the same numbers are used throughout the disclosure and the figures to reference like components and features. In some cases, numbers in the 100 series refer to features originally found in FIG. 1; numbers in the 200 series refer to features originally found in FIG. 2; and so on.

DESCRIPTION OF EMBODIMENTS

Figure 1:
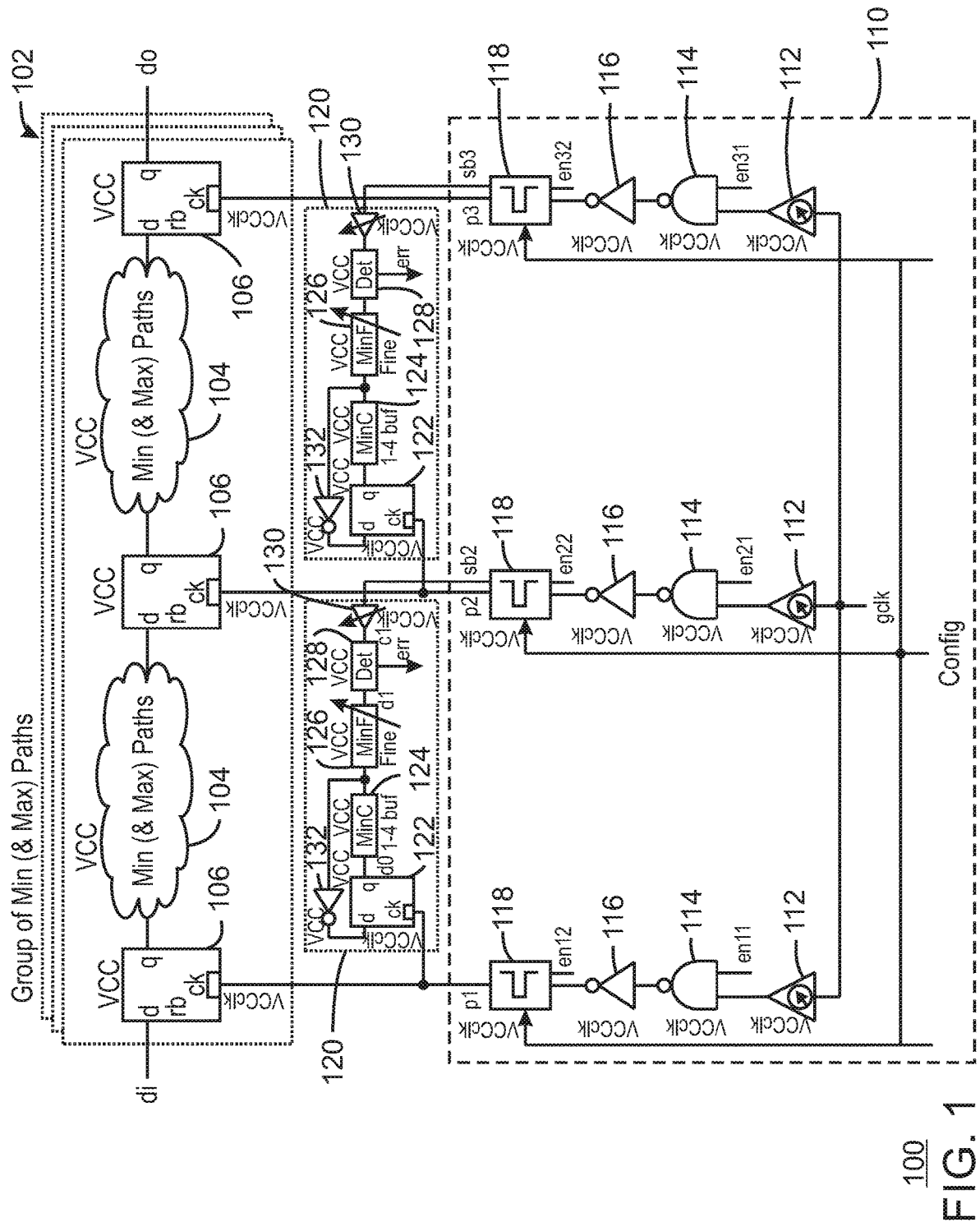
FIG. 1 illustrates a circuit in accordance with some embodiments.

Some embodiments relate to solving minimum delay failure issues in energy-efficient pulsed latch based designs. Clocking power can be responsible for a dominant power share (up to 50% of the power share, for example) of products such as central processing unit (CPU) and graphics processing unit (GPU) products, for example. Replacing single-edged triggered flip flops with pulsed latches allows for a reduction of total clocking power. In some products, it is also possible to remove latches (such as, for example, phase 2 latches and pulsed phase 1 latches, or vice-versa) to reduce clocking power. On one hand, a pulse width (PW) may need to be long enough to avoid pulse evaporation and to ensure latch write-ability. However, on the other hand, the pulse width (PW) may need to be as short as possible to minimize degradation of minimum delay slack and to avoid minimum delay errors.

In some ways, minimum delay errors (MDEs) can be more severe than maximum delay errors, since an entire integrated circuit (such as a System on Chip or SoC) can fail due to one minimum delay error (MDE). Such a failure cannot typically be fixed by changing the operating frequency. However, minimum delay errors can be sensitive to voltage. Minimum delay errors can be more likely at low voltages, so some minimum delay errors may be corrected by slightly increasing voltage. In general, however, minimum delay failures can be very severe. Once minimum delay failures occur after production, it can be extremely difficult to avoid them. Minimum delay failures can eventually lead to yield loss due to parts that do not work.

U.S. Pat. No. 9,520,877 relates to an apparatus and method for detecting and repairing minimum delay (min-delay) errors for flip-flops, but does not discuss detecting, repairing, or correcting minimum delay (min-delay) errors for pulsed latches.

Different clocking styles may be used in different digital circuits. Many digital circuits use single-edge triggered flip-flops. However, the two latches (e.g., master latch and slave latch), constituting a single-edge triggered flip-flop, may be replaced with a single pulsed latch that is clocked by a pulse. Such a use of pulsed latches can enable power savings, since pulsed latches can be more energy efficient than flip-flops.

Minimum delay errors are more likely to occur (and/or can be more severe) in pulsed latch designs than in flip-flop designs, since, for example, data may race through the pipeline more easily in designs with pulsed latches. Therefore, detecting minimum delay failures and correcting for those failures can be very important in designs using pulsed latches. In some embodiments as disclosed herein, minimum delay (min-delay) error (MDE) detection, prediction, correction, repair, prevention, and/or avoidance may be implemented for designs based on pulsed latches.

Several ways to attempt to avoid minimum delay errors in designs based on pulsed latches may include conservative minimum delay buffering and/or "useful skew". However, such solutions may incur large area, power, and performance penalties. It may be possible to isolate and locate minimum delay errors in the lab. For example, relying on MUX-D scan or level-sensitive scan design (LSSD) scan and dedicated automatic test pattern generation (ATPG) test vectors, the minimum delay errors (MDEs) can possibly be located. However, even after the minimum delay errors (MDEs) have been located, they cannot be repaired without a re-spin of the chip or increasing the supply voltage (VCC) of the entire design, such as the entire very-large scale integration (VLSI) design. Such re-spins can result in high cost and increased time to market (TTM), while increasing the supply voltage results in increased power consumption. Therefore, in accordance with some embodiments, fast detection and correction (and/or repair) of minimum delay errors (MDEs) may be implemented by adjusting post-silicon tunable (PST) clock buffers, and/or by selectively increasing the supply voltage (VCCclk) of the clock buffers and/or other elements in the clock distribution network (such as clock gates or pulse generators). By slightly reducing a delay of a replica data path, MDEs may be predicted and avoided, rather than or in addition to detecting and correcting the MDEs. This can result in lower cost, faster time to market, and/or lower power consumption, for example.

In some embodiments, an error can be predicted, and prevention of that error can be implemented. In some embodiments, an error can be detected and corrected (for example, by stopping the operation and replaying the operation after the post-silicon tunable (PST) clock buffers have been adjusted and/or the supply voltage VCCclk of the clock distribution network has been increased for correction of the error).

FIG. 1 illustrates a circuit 100 in accordance with some embodiments. In some embodiments, FIG. 1 illustrates a block diagram of a circuit such as a digital circuit and/or a generalized VLSI circuit (for example, such as a circuit of a processor, CPU, core, graphics processor, and/or GPU). In some embodiments, circuit 100 includes a minimum delay path replica (MDPR) with error detector (DET) for designs such as VLSI designs based on pulsed latches. In some embodiments, circuit 100 may be included in any digital circuit that is clocked (for example, in a CPU, a GPU, and/or an SoC).

In some embodiments, circuit 100 includes many groups 102 (data paths 102, or data pipelines 102) of minimum and maximum timing paths 104 arranged between synchronization points implemented as pulsed latches 106.

In some embodiments, circuit 100 includes a clock distribution network 110 (for example, clock distribution circuit 110 or clock tree 110). Although clock distribution network 110 is illustrated in FIG. 1 as having three clock branches for illustration purposes, it is noted that any number of clock branches may be included in accordance with some embodiments. Clock distribution network 110 includes global clock buffers 112, NAND gates 114 with clock enable inputs (en11, en21, en31, etc.), inverters 116, and pulse generators 118 with clock pulse enable inputs (en12, en22, en32, etc.) In some embodiments, global clock buffers 112 may be tunable. In some embodiments, global clock buffers 112 may be adjusted to correct for minimum delay failures. In some embodiments, global clock buffers 112 may be post-silicon tunable (PST) coarse and fine buffers. In some embodiments, NAND gate 114 and inverter 116 might constitute a clock gating cell. This clock gating cell can also include a latch to latch the enable signals en11, en21, en31, etc. In some embodiments, pulse generators 118 may be modified to enable detection, prediction, correction, repair, prevention, and/or avoidance of minimum delay failures.

A global clock signal gclk is input to the global clock buffers 112. In accordance with some embodiments, a situation in which clock branches are fully diverged may be a worst case scenario for minimum delay errors. However, in some embodiments, an implementation using partially or fully converged clock branches or clock trees (for example, in some embodiments of clock distribution circuit 110) may not be as bad for minimum delay errors. In some embodiments, global clock buffers 112 can be tunable. The delay of global clock buffers 112 can be adjusted to adjust and correct for minimum delay errors (minimum delay failures).

In some embodiments, the Config signal (for example, configuration signal) is provided to pulse generators 118, and can be used to adjust the pulse width (PW). The Config signal may be provided, for example, by fuses (for example, in a product) or by a scan chain (for example, on a test chip). For example, in some embodiments, the Config signal can be a post-silicon pulse width (PW) configuration signal. That is, the pulse provided by pulse generators 118 can be longer or shorter in response to the Config signal in FIG. 1. For example, in changing the pulse width (PW) using the Config signal input to the pulse generators 118, the operating frequency of the device may be adjusted accordingly. For example, if increasing the pulse width (PW) to enable more time borrowing, the operating frequency of the device may be increased accordingly. In order to minimize minimum delay failure risk, for example, a shorter pulse is provided using the Config signal input to the pulse generators 118.

In some embodiments, the data paths 102 and clock distribution network 110 may be supplied by the same supply voltage (for example, by the same global supply voltage VCC). For example, in some embodiments, supply voltage VCC and supply voltage VCCclk as illustrated in FIG. 1 are the same voltage (for example, are the same global supply voltage). In some embodiments, data paths 102 may be supplied with supply voltage VCC (for example, supplied with a global supply voltage VCC) and clock distribution network 110 may be supplied with a separate supply voltage VCCclk that is different than supply voltage VCC. In some embodiments, where a separate supply voltage VCCclk is provided for the clock distribution network 110 than the supply voltage VCC supplied to the data paths 102, the supply voltage VCCclk may be adjusted (for example, may be increased) without affecting the supply voltage VCC for the rest of the circuit. In some embodiments, post-silicon configurable or post-silicon tunable (PST) clock buffers (such as global clock buffers 112) may be used to minimize skew and boost a maximum operating frequency (Fmax) after manufacturing.

As discussed above, although clock distribution network 110 is illustrated in FIG. 1 as having three clock branches for illustration purposes, it is noted that any number of clock branches may be included in accordance with some embodiments. In some embodiments, for one data path or pipeline stage, the clock branch on the far left including the global clock buffer 112, NAND gate 114, inverter 116, and pulse generator 118 on the far left can be a launch clock path and the clock branch in the middle including the global clock buffer 112, NAND gate 114, inverter 116, and pulse generator 118 in the middle can be a capture clock path. Similarly, in some embodiments, for another data path or pipeline stage, the clock branch in the middle including the global clock buffer 112, NAND gate 114, inverter 116, and pulse generator 118 in the middle can be a launch clock path and the clock branch on the far right including the global clock buffer 112, NAND gate 114, inverter 116, and pulse generator 118 on the far right can be a capture clock path.

In some embodiments, circuit 100 includes minimum delay path replica (MDPR) circuits 120, which may include error detection and/or error prediction, and can assign a separate VCCclk for the clock distribution network 110. Each of the minimum delay path replica circuits 120 can be a replica circuit replicating a respective portion of the pipeline 102 in order to replicate minimum delay timing conditions in several or all portions of the pipeline. Further, in some embodiments, each of the minimum delay replica circuits 120 can be implemented or configured so that it can determine a failure (or error) a little bit before the actual pipeline fails (that is, for example, in order to predict a failure/error in the pipeline in advance). In this manner, minimum delay path replica circuits 120 can predict when it may become dangerous to operate (that is, due to an impending minimum delay failure or error), for example, at low voltage. Once a minimum delay path replica circuit 120 detects such a failure/error, operating voltage can be increased to avoid the dangerous situation prior to pipeline failure. This pipeline failure/error prediction may be accomplished by adjusting delays in the minimum delay path replica circuits 120. For example, a tunable minimum delay path replica may be implemented, and/or other buffers may be tunable, in order to adjust the delays. In this manner, delays may be adjusted to obtain a failure in a minimum delay path replica circuit 120 earlier than in the actual data paths 104 or pipeline 102, for example.

Minimum delay path replica circuits 120 may include pulsed latches 122 (for example, launch pulsed latches 122), coarse delay elements (MinC) 124, fine delay elements (MinF) 126, error detectors (DET) 128, post-silicon configurable delay elements 130, and inverters 132. The minimum delay path replica circuits 120 include the pulsed latch 122 receiving a launch pulse signal (for example, a launch pulse signal p1 or p2) and launching a data signal d0 to a post-silicon configurable minimum delay path replica. The data signal d0 eventually propagates to the error detector (DET) 128. The pulsed latch 122 of each of the minimum delay path replica circuits 120 can work as a toggle flip-flop. The minimum delay path replica circuits 120 include the coarse delay elements 124 (MinC) and fine delay elements 126 (MinF), which may be used to replicate the functional minimum delay paths 104. For example, in some embodiments, the coarse delay elements 124 may include a number of buffers (for example, one to four buffers) to add more or less delay. Coarse delay elements 124 (MinC) can provide more or less delay, and fine delay elements 126 (MinF) can provide a fine tuning of the delay in accordance with some embodiments.

It is noted that replica circuits 120 may require margins or guard bands to deal with within-die (WID) parametric variations. However, replica circuits 120 can eliminate or significantly reduce guard bands for global process-voltage-temperature (PVT) as well as aging variations, which are more significant than WID parametric variations. Replica circuits 120 may lead to clear power and/or performance benefits despite any WID parametric variations.

A signal of the minimum delay path replica circuits 120 (for example, d1 in the left side minimum delay path replica circuit 120) samples the phase of the capture clock (for example, capture clock c1 in the left side minimum delay path replica circuit 120) to determine the absence or occurrence of a minimum delay error. In some embodiments, the delay of the replica data path with configurable delay (for example, including elements 122, 124 and 126) is always lower than T/2 by design, where T denotes the clock period.

In some embodiments, the capture clock signal c1 may be derived from one or more of a pulse generator 118 and a post-silicon configurable delay element 130 (for example, to replicate the hold time of the latches in the functional pipelines such as pipelines 102). Capture clock signal c1 may, for example, be high during the second half of the global clock period, and remain high until the end of the clock pulse (for example, until the end of the clock pulse p2). The minimum delay paths (min-delay paths) may start to arrive at the capturing pulsed latches (for example, pulsed latches 106 in pipelines 102) or at the detector DET 128 of the replica circuit 120 only after the termination of pulse p2. Therefore, if the pulse p2 was not terminated or has not yet started, signal d1 can sample the high phase of the capture clock c1, and an error signal (err) will be issued.

In some embodiments, an error can be predicted, and prevention of that error can be implemented. For example, in some embodiments, an error can be predicted and then the error can be avoided altogether from happening in the pipeline (for example, by increasing the clock supply voltage and/or adjusting clock buffers such as the global clock buffers 112). In some embodiments, replica circuits may be used that can detect an error before a real error occurs in the actual pipeline (for example, to predict an error). A replica circuit (for example, such as one or more of the minimum delay path replica circuits 120) can be adjusted to detect a failure before an actual failure occurs in the pipeline (for example, before an actual failure occurs in data pipelines 102). For example, according to some embodiments, upon detection of an error in a replica circuit, data operation in the pipeline continues with an increased delay of the clock buffer on the generating (or launching) clock path, with a decreased delay of the clock buffer on the capture clock path, and/or with an increased clock supply voltage. In this manner, errors such as minimum delay errors may be prevented from occurring in the pipeline (data paths) to avoid minimum delay errors in accordance with some embodiments.

In some embodiments, an existing error can be detected and then corrected or repaired (for example, by stopping the operation and replaying it for correction or repair of the error). In some embodiments, for example, the error may be corrected by stopping the pipeline and replaying at a slightly higher clock supply voltage, with a decreased delay of the clock buffer on the capture clock path, and/or with an increased delay of the clock buffer on the generating (or launching) clock path.

Figure 2:
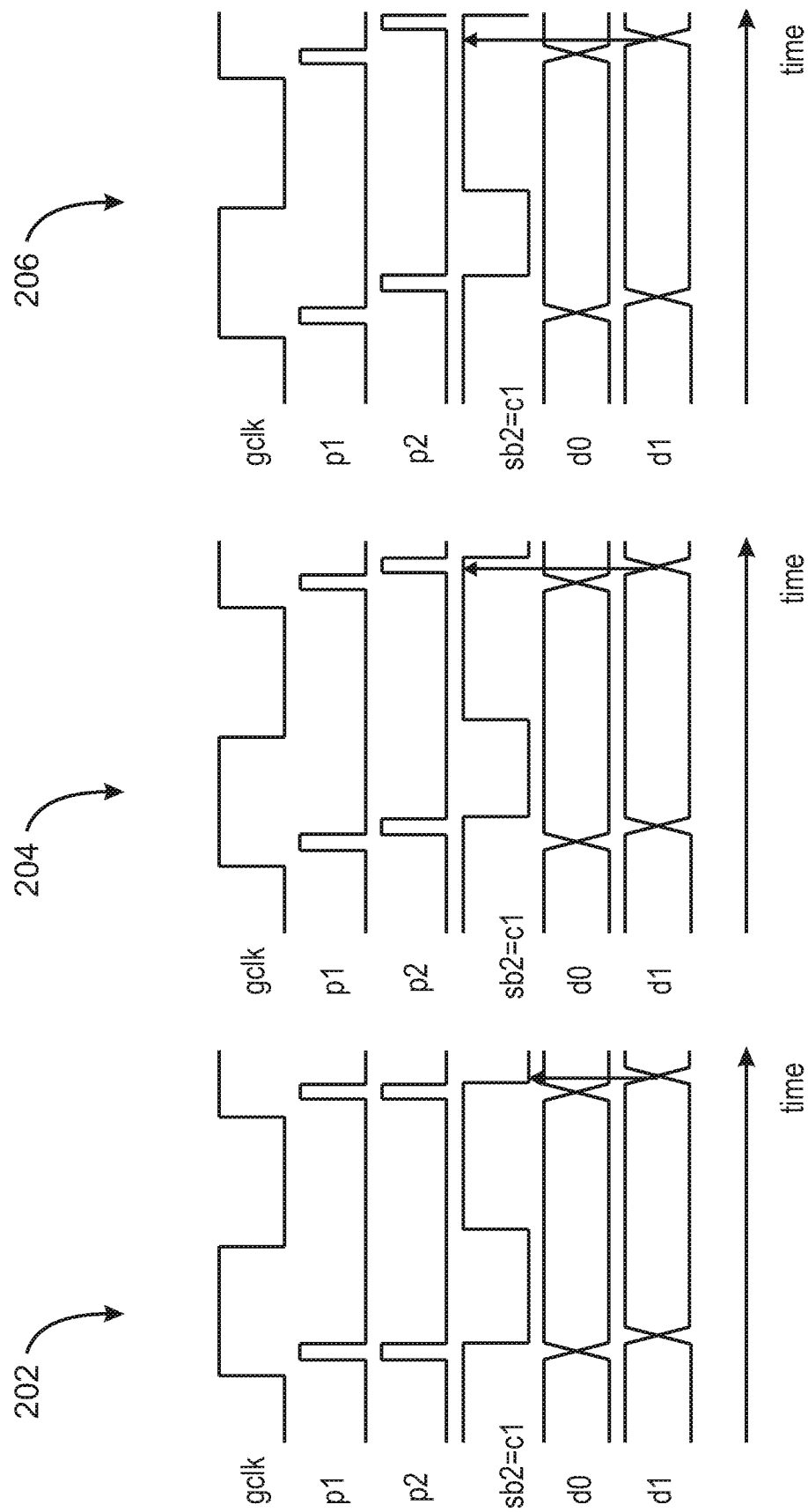
FIG. 2 illustrates waveforms in accordance with some embodiments.

FIG. 2 illustrates timing diagram waveforms 200 in accordance with some embodiments. Waveforms 200 illustrate, for example, how a data pipeline operates. For example, in some embodiments, waveforms 200 illustrate how the data pipeline in circuit 100 of FIG. 1 operates. In some embodiments, waveforms 200 include timing diagram waveforms 202 illustrating a case with no minimum delay error (failure), timing diagram waveforms 204 illustrating a first case of minimum delay error (failure), and timing diagram waveforms 206 illustrating a second case of minimum delay error (failure). That is, FIG. 2 includes example waveforms 200 illustrating an error-free case (waveforms 202), and illustrating two error cases where pulse p2 is not terminated or not yet started when data d1 arrives (waveforms 204 and 206).

In some embodiments, waveforms 200 include waveforms for global clock (gclk), launch pulse 1 (p1), capture pulse 2 (p2), inverted stop pulse replica sb2 (clock c1), data d0, and data d1 signals (for example, corresponding to those signals in circuit 100 of FIG. 1). In some embodiments, signal sb2 may be used to verify that signal d1 is valid. In some embodiments, pulse p1 clocks a first pulsed latch (for example, pulse p1 clocks the furthest left pulsed latch 106 in FIG. 1), and pulse p2 clocks a second pulsed latch (for example, pulse p2 clocks the middle pulsed latch 106 in FIG. 1). Ideally, without any variation or delay, pulses p1 and p2 should pulse at the same time, as illustrated in waveforms 202. In some embodiments, if pulse p2 is already low when d1 transitions, no minimum delay failures occur. Otherwise, if pulse p2 is still high when d1 transitions, as illustrated in waveforms 204, or if pulse p2 is not yet asserted, as illustrated in waveforms 206, data d1 may be captured on the second latch one clock cycle too early, and a data race through may occur.

In some embodiments, waveforms 202 illustrate a situation in which minimum delay errors and data race through do not occur. In waveforms 202, for example, data d1 arrives after pulse p2 has transitioned low. A signal d1 transition samples a low c1 phase signal when pulse p2 has already terminated (for example, as shown by the upward facing arrow from the d1 signal transition). In this case, since pulse p2 has already terminated at the d1 transition to sample the low c1 phase, waveform 202 illustrates a case in which no minimum delay error (min-delay error) occurs. For example, in such a case, no error flag (for example, "err" signal in a minimum delay path replica circuit such as one of circuits 120) is asserted, since the signal d1 samples a low phase of clock signal c1. This can happen when the capture pulse p2 has already been terminated when a data d1 transition occurs, for example.

In some embodiments, waveforms 204 illustrate a situation in which minimum delay errors and data race through can occur, and incorrect data may be in the pipeline. In waveforms 204, for example, data d1 arrives while pulse p2 is still high. A signal d1 transition samples a high c1 phase signal when pulse p2 is still high (for example, as shown by the upward facing arrow from the d1 signal transition). In this case, since pulse p2 is still high at the d1 transition to sample the high c1 phase, waveform 204 illustrates a case in which a minimum delay error (min-delay error) occurs. For example, in such a case, an error flag (for example, "err" signal in a minimum delay path replica circuit such as one of circuits 120) is asserted, since the signal d1 samples a high phase of clock signal c1. This can happen when the capture pulse p2 is still asserted while a data d1 transition has already arrived, for example.

In some embodiments, waveforms 206 illustrate another situation in which minimum delay errors and data race through can occur, and incorrect data may be in the pipeline. In waveforms 206, for example, data d1 arrives before pulse p2 is initiated. A signal d1 transition samples a high c1 phase signal before pulse p2 occurs (for example, as shown by the upward facing arrow from the d1 signal transition). In this case, since pulse p2 has not yet occurred at the d1 transition to sample the high c1 phase, waveform 206 illustrates a case in which a minimum delay error (min-delay error) occurs. For example, in such a case, an error flag (for example, "err" signal in a minimum delay path replica circuit such as one of circuits 120) is asserted, since the signal d1 samples a high phase of clock signal c1. This can happen when the capture pulse p2 is not yet asserted while a data d1 transition has already arrived, for example.

In some embodiments, signal sb2 may be used to verify that signal d1 is valid. In some embodiments, signal sb2, which can be output from a pulse generator such as one of the pulse generators 118 in FIG. 1, for example, can be specifically designed to go low after pulse p2 goes low, or while pulse p2 goes low. Therefore, signal sb2 can be used to determine whether pulse p2 has already been terminated, is still asserted, or has not yet been asserted. In this manner, a data signal such as data signal d1 in a minimum delay path replica circuit such as one of minimum delay path replica circuits 120 of FIG. 1 can be used to sample the value of signal sb2. For example, in the first case illustrated by waveforms 202, signal sb2 is sampled at the d1 data signal transition and the sampled sb2 value is "0", indicating no minimum delay error and that the pipeline operates correctly. However, in the situations illustrated by waveform 204 and 206, signal sb2 is sampled at the d1 data signal transition and the sampled sb2 value is "1", indicating a minimum delay error and that the pipeline is not operating correctly.

In some embodiments, when a minimum delay error (min-delay error) is detected (for example, when a minimum delay error is detected using one or more minimum delay path replica circuit such as one or more circuit 120), a repair scheme (or a combination of repair schemes) may be triggered. For example, when a minimum delay error is detected, it may be repaired or corrected using one of the following (or a combination of two or more of the following):

Increasing the delay of a clock buffer such as a post-silicon configurable (PST) clock buffer on a launch clock path (that is, on a launching clock path or a generating clock path). This can help to delay the data so that it will arrive later;

Decreasing the delay of a clock buffer such as a post-silicon configurable (PST) clock buffer on a capture clock path. Decreasing delay of the capturing clock can help to make sure that the capturing clock arrives earlier;

Slightly increasing the clock supply voltage (for example, voltage VCCclk), for example, in order to reduce impact of parametric variations, and/or decrease skew between launch and capture clocks; and/or Reducing (or shortening) a clock pulse width (PW).

In some embodiments, one or more minimum delay error repairs may be implemented. The one or more minimum delay error repairs may include one or more of adjusting a clock buffer to delay a launch clock, adjusting a clock buffer to speed up a capture clock, increasing a supply voltage of a clock distribution circuit (for example, increasing VCCclk), increasing a global supply voltage (for example, increasing VCC), and/or reducing (shortening) a pulse width (PW). It is noted that a long pulse width (PW) may be required, for example, for time borrowing and/or maximum frequency (Fmax) gain. In case of a long pulse width (PW), the pulse width (PW) may be reduced (or shortened) to correct or to avoid a minimum delay error. This may be implemented, for example, if the pulse width (PW) is still longer than a minimum required pulse width (PW) required for latch write-ability (that is, for example, for reliable latch write operation).

In some embodiments, while increasing the clock supply voltage (for example, VCCclk) that is supplying the clock distribution network, the main supply voltage (for example, VCC) for the rest of the circuit (for example, the VLSI circuit) remains constant. The power overhead of such a minimum delay error repair technique can be significantly lower compared to a solution in which the main supply voltage (for example, VCC) is raised for the entire circuit (for example, the entire VLSI circuit). In some embodiments, the clock supply voltage (VCCclk) can supply a clock inverter that is internal to pulsed latches in the data path, and/or can supply a post-silicon configurable delay element inside a minimum delay path replica such as one or more of MDPR circuits 120 of FIG. 1 (for example, can supply a post-silicon configurable delay element such as delay element 130 generating capture clock c1).

In some embodiments, the clock supply voltage (VCCclk) is raised to fix minimum delay errors, which, as a side effect, can decrease (for example, can slightly decrease) the clock latency (or clock insertion delay). This can be a positive side effect. In addition, the clock skew may also decrease (for example, may also slightly decrease).

In some embodiments, one or more fully integrated voltage regulators (FIVR) can be used to generate and sequence two or more power supplies. In some embodiments, this can be implemented without level shifters and isolation cells. In some embodiments, the clock and main power supplies can always be on or off at the same time, which can avoid use of isolation cells. In some embodiments, the clock supply (for example, supplying VCCclk) can be slightly higher than the main supply (for example, supplying VCC) for data paths, which can avoid use of level shifters. For example, the clock may be driven from a slightly higher power supply domain into a slightly lower power supply domain without use of level shifters. In some embodiments, however, level shifters may be used for clock enable signals.

It is noted that repairing minimum delay failures in one place by adjusting post-silicon tunable (PST) clock buffers might create a maximum delay failure in another place. In some embodiments, one or more (or several) other PST clock buffers may be adjusted until some amount of time is borrowed from one or more non-critical max paths to avoid max delay issues. In some embodiments, a part which is functional (with no minimum delay failures) may be operated at a slight maximum frequency (for example, Fmax) penalty as compared to a baseline part that is inevitably non-functional due to a minimum delay failure. In accordance with some embodiments, if minimum delay failures are repaired by slightly increasing the clock supply voltage (for example, VCCclk), adverse impact on maximum timing can be avoided.

In some embodiments, one or more min-delay path replica (MDPR) such as, for example, one or more MDPR circuits 120, may be added to groups of minimum (min) paths (which may be intertwined with groups of maximum or max paths) in a VLSI design (for example, such as a core design or a GT design). The MDPR circuit(s) may include a launch pulsed latch (for example, such as pulsed latch 122), a short data path with configurable delay (for example, including delay elements 122, 124, and/or 126), and an error detector (for example, such as error detector 128). An error detector can be included in the MDPR circuits rather than a capture pulsed latch, for example. In some embodiments, the replica data path may be adjusted to be slightly shorter than a worst minimum delay path in an associated group of minimum (and/or maximum) paths. In some embodiments, if the MDPR circuit detects an error (err) such as a minimum delay error (MDE), or the onset of an error such as a minimum delay error, one or more of the following minimum delay error repair (or minimum delay error correction) techniques may be triggered:

Adjust a post-silicon tunable (PST) clock buffer (for example such as one or more clock buffer 112) to delay a launch clock.

Adjust a post-silicon tunable (PST) clock buffer (for example such as one or more clock buffer 112) to speed up a capture clock.

Slightly increase a supply voltage (for example, such as supply voltage VCCclk) of a clock distribution circuit (for example, such as clock distribution circuit 110).

Reduce (or shorten) a clock pulse width (PW).

In some embodiments, clocking power may be reduced (for example, due to pulsed latches), and minimum delay errors, which may be aggravated by pulsed latches, may be eliminated. It is noted that pulsed latches can enable power savings. For example, in some cores, pulsed latches might enable significant power savings at the core level. In accordance with some embodiments, the ability to quickly detect and repair minimum delay errors (min-delay errors) can allow for lower cost and shorter time to market. This can be implemented without relying on level-sensitive scan design (or LSSD scan), MUX-D scan, mux-D/LSSD, automatic test pattern generation (ATPG), and/or re-spin of the product, for example. Additionally, in some embodiments, minimum delay failures may be predicted and avoided. Minimum delay failures due to aging may thus be avoided, leading to increased and extended product reliability.

Figure 3:
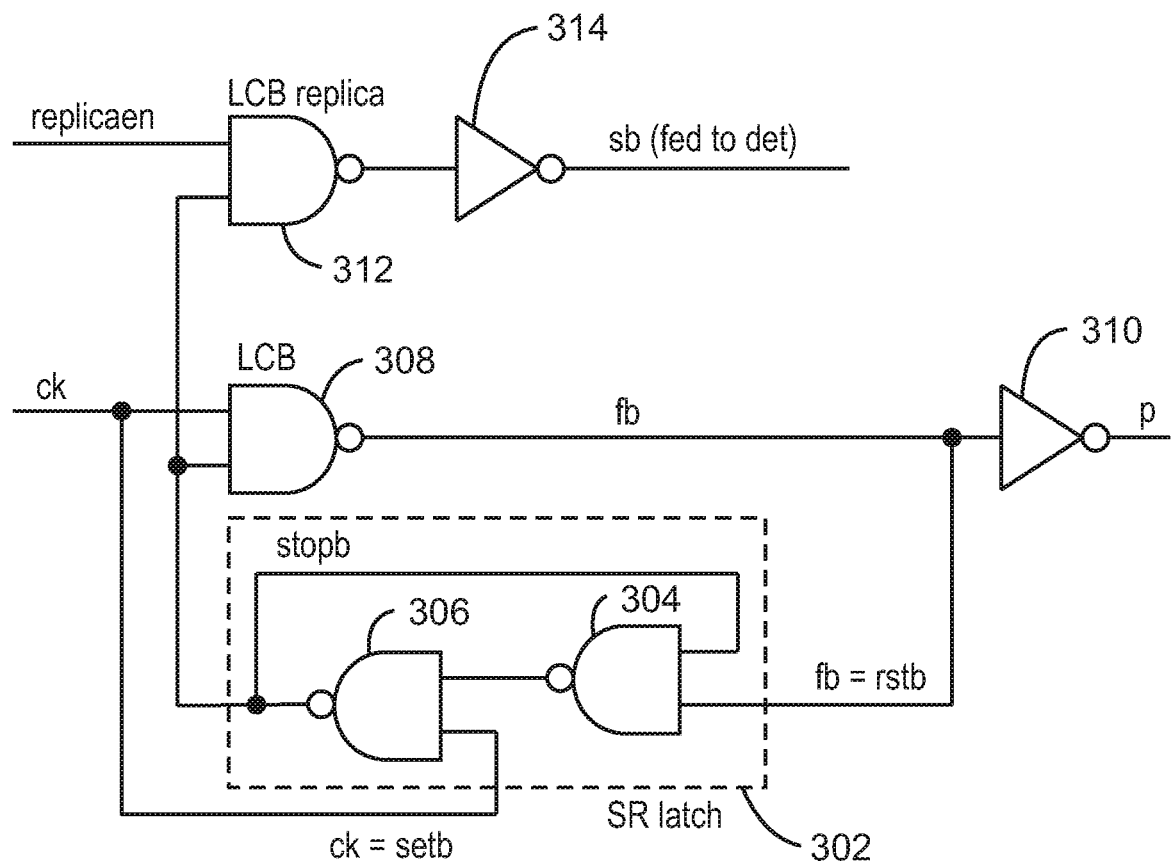
FIG. 3 illustrates a circuit in accordance with some embodiments.

FIG. 3 illustrates a pulse generator circuit 300 in accordance with some embodiments. In some embodiments, pulse generator circuit 300 may be a pulse generator modified to enable detection, prediction, correction, repair, prevention, and/or avoidance of minimum delay failures. In some embodiments, for example, circuit 300 can be included in any one or more of the pulse generators 118 illustrated in FIG. 1. In some embodiments, circuit 300 is a pulse generator suitable for pulsing functional latches and enabling minimum delay error detection.

In some embodiments, pulse generator circuit 300 can enable pulsed latches. For example, pulse generator circuit 300 can provide a pulse signal p (for example, can provide a pulse signal p such as a launch pulse or a capture pulse, and/or such as one or more of pulses p1, p2, and/or p3 illustrated in FIG. 1). In addition, pulse generator circuit 300 can generate a stop pulse replica bar signal sb which is inverted or active low (for example, can generate the inverted stop pulse replica signal sb2 or the inverted stop pulse replica signal sb3 of FIG. 1) in order to help determine if a minimum delay error occurs or has occurred. The sb signal can be used to feed timing information to a minimum delay error detector such as, for example, one of the detectors 128 of a minimum delay path replica circuit such as one of the minimum delay path replica circuits 120 of FIG. 1.

Pulse generator circuit 300 can include a latch (for example, an SR latch) 302 including a NAND gate 304 and a NAND gate 306. Circuit 300 can also include a NAND gate 308, an inverter 310, a NAND gate 312, and/or an inverter 314. In some embodiments, NAND gate 304, NAND gate 306, NAND gate 308, and inverter 310 form a pulse generator core. In some embodiments, NAND gate 312 and inverter 314 enable minimum delay error detection, prediction, correction, repair, prevention, and/or avoidance. In some embodiments, circuit 300 is a pulse generator that uses a single NAND gate rather than a multiplexer (mux) to drive node stopb (stop pulse, active low). Such a pulse generator using a single NAND gate to drive node stopb can be slightly more area efficient than, and can be more power efficient than, a pulse generator using a multiplexer to drive node stopb.

Latch 302 can be added to a local clock buffer (for example, containing NAND gate 308 and inverter 310) in order to enable pulsed latches. Use of latch 302 in pulse generator 300 (and/or in pulse generators 118) can enable replacement of flip-flops with pulsed latches, and obtain similar pipeline functionality.

In some embodiments, circuit 300 includes replicating (replica) circuits within a pulse generator used to help enable minimum delay error detection for pulsed latches. Gate 312 and gate 314 can help to enable detection, prediction, correction, repair, prevention, and/or avoidance of minimum delay failures (or minimum delay errors). The output sb signal from inverter 314 can be input to a minimum delay path replica (such as a minimum delay path replica 120 of FIG. 1, for example, as signal sb2, sb3, etc. in FIG. 1). This output sb signal from circuit 300 can be provided, for example, to a detector (such as a detector 128 of FIG. 1) to detect failures in the pipeline (such as minimum delay failures in the pipeline). Replica enable signal replicaen may be an enable signal that can turn on or off the circuit including gate 312 and inverter 314, thus enabling or disabling a feature of detecting minimum delay errors, for example.

Figure 4:
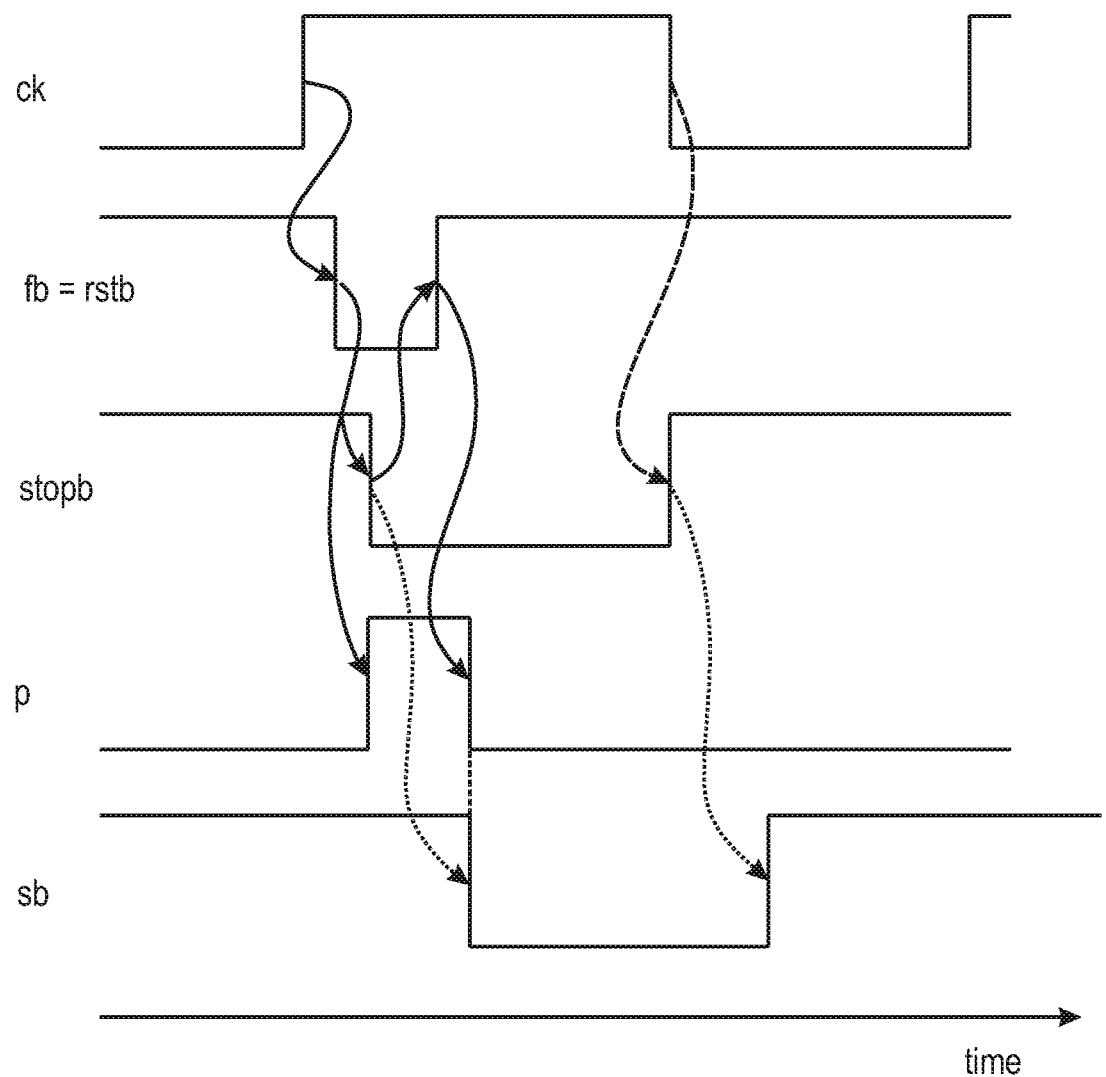
FIG. 4 illustrates waveforms in accordance with some embodiments.

FIG. 4 illustrates timing diagram waveforms 400 in accordance with some embodiments. In some embodiments, timing diagram waveforms 400 illustrate waveforms for various nodes in circuit 300, including clock ck, inverted pulse fb (=rstb), inverted stop pulse stopb (for example, stop pulse, active low), pulse p (for example, pulse p1, p2, and/or p3 of FIG. 1), and inverted stop pulse replica sb or capture clock c (such as, for example, sb2, sb3, c1, etc. of FIG. 1). In order to maintain reliable operation, the back edge of inverted pulse fb can be generated by the front edge of the same inverted pulse fb, in accordance with some embodiments.

In some embodiments, in order to generate the capture clock (for example, in order to generate capture clock c1 feeding into the minimum delay error detector 128) a local clock buffer replica (or LCB replica) including NAND gate 312 and inverter 314 is added to the baseline pulse generator core. A replica enable signal (replicaen) is fed as an input to the NAND gate 312. This replica enable signal may be used to turn on or turn off a minimum delay path replica (such as, for example, one or more of MDPR circuits 120 of FIG. 1). Replica enable signal replicaen may be, for example, one of the replica enable signals en12, en22, or en32 of FIG. 1. The other signal stopb feeding into the NAND gate 312 of the LCB replica can initiate termination of the clock pulse (for example, can initiate termination of clock pulse p in FIG. 3), and will be asserted high again during the second half of the global clock period. If delayed by an LCB delay and a latch hold time, this signal is appropriate for being sampled by the minimum delay error detector (for example, by detector 128 of FIG. 1). The signal is high before (for example, T/2 before) and during the clock pulse. In some embodiments, the entire minimum delay path replica (MDPR) circuit (for example, one or more of circuits 120 of FIG. 1) can be clock gated by asserting the replica enable signal replicaen=0 in order to avoid dynamic power consumption when minimum delay debug and/or minimum delay monitoring is not required, for example. Note that, to this end, the pulse received by the launch pulse latch (for example, launch pulse latch 122 in minimum delay path replica (MDPR) circuit 120 in FIG. 1) is also clock gated by the replica enable signal replicaen.

Figure 5:
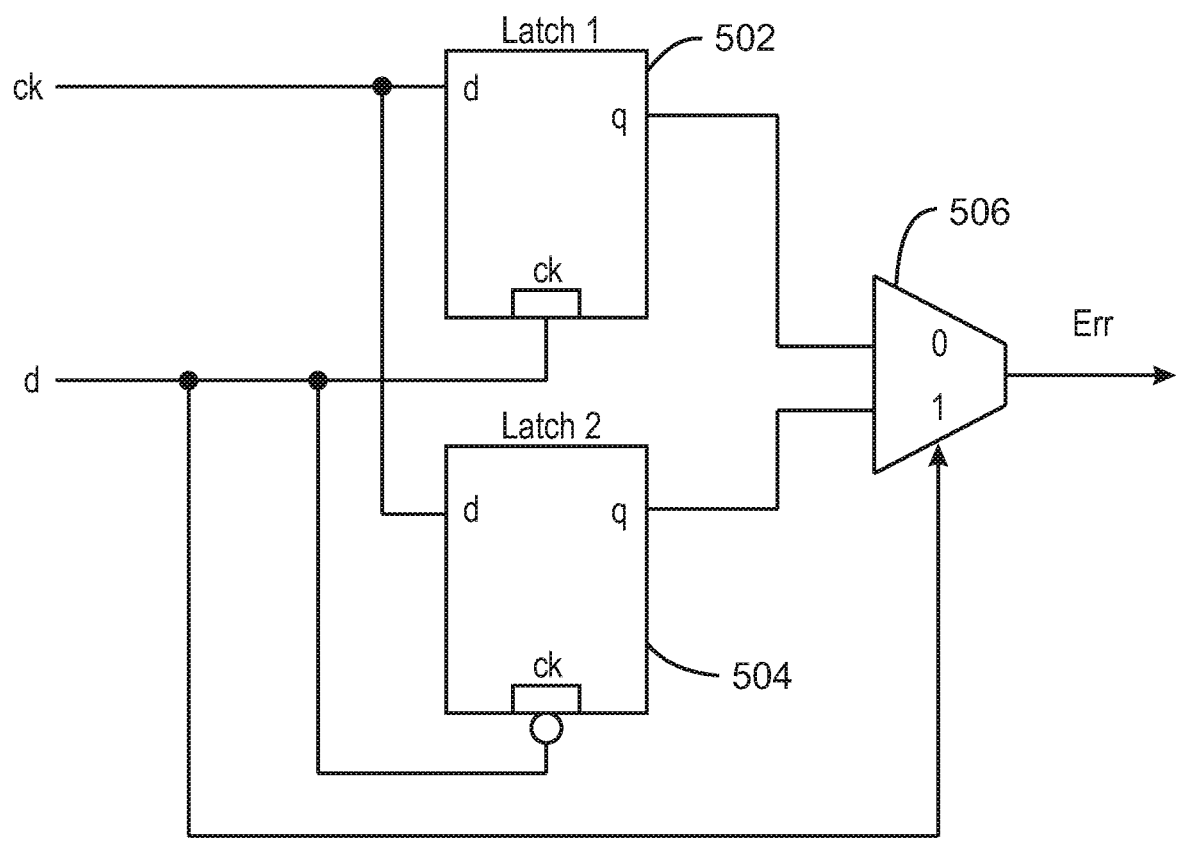
FIG. 5 illustrates a circuit in accordance with some embodiments.

FIG. 5 illustrates a detector circuit 500 in accordance with some embodiments. In some embodiments, for example, circuit 500 can be included in any one or more of the detectors 128 illustrated in FIG. 1. In some embodiments, circuit 500 is a minimum delay error detector. In some embodiments, circuit 500 is a minimum delay error detector containing a dual-edge triggered flop.

Detector circuit 500 can include a latch 502 (Latch 1), a latch 504 (Latch 2), and a multiplexer 506. A signal d of a minimum delay path replica (MDPR), such as, for example, signal d1 in FIG. 1, can connect to the d input of the minimum delay detector including latch 502, latch 504, and multiplexer 506. When transitioning high or low, d can sample a phase of an input capture clock signal ck (for example, such as capture clock signal c1 in FIG. 1). For example, when transitioning high or low, d can sample a phase of an input signal sb (for example, such as signal sb2 in FIG. 1 and/or in FIG. 2).

In some embodiments, detector circuit 500 can determine if the ck signal or sb signal (for example, signal sb2) input to circuit 500 and output from a pulse generator (for example, such as one of the pulse generators 118, pulse generator 300, etc.) is sampled low or sampled high upon transition of a data signal d (for example, upon transition of a data signal such as data signal d1 illustrated in FIG. 1 and/or in FIG. 2). In response, the detector circuit 500 can supply an error signal "Err" to indicate a minimum delay error or minimum delay failure in response to the sampling of the ck signal or sb signal upon transition of the data signal d.

The techniques described herein may interface with and/or control computing devices such as, for example, one or more of power management unit(s), voltage regulator(s), power management integrated circuit(s), and/or other devices, for example, to control and/or adjust voltage, adjust buffer delays, etc. For example, a controller may be used to provide a warning signal to such a power management unit to indicate that a voltage should be increased, for example. Although this may be generally implemented in hardware, it is recognized that software and/or firmware may be used in accordance with some embodiments.

Figure 6:
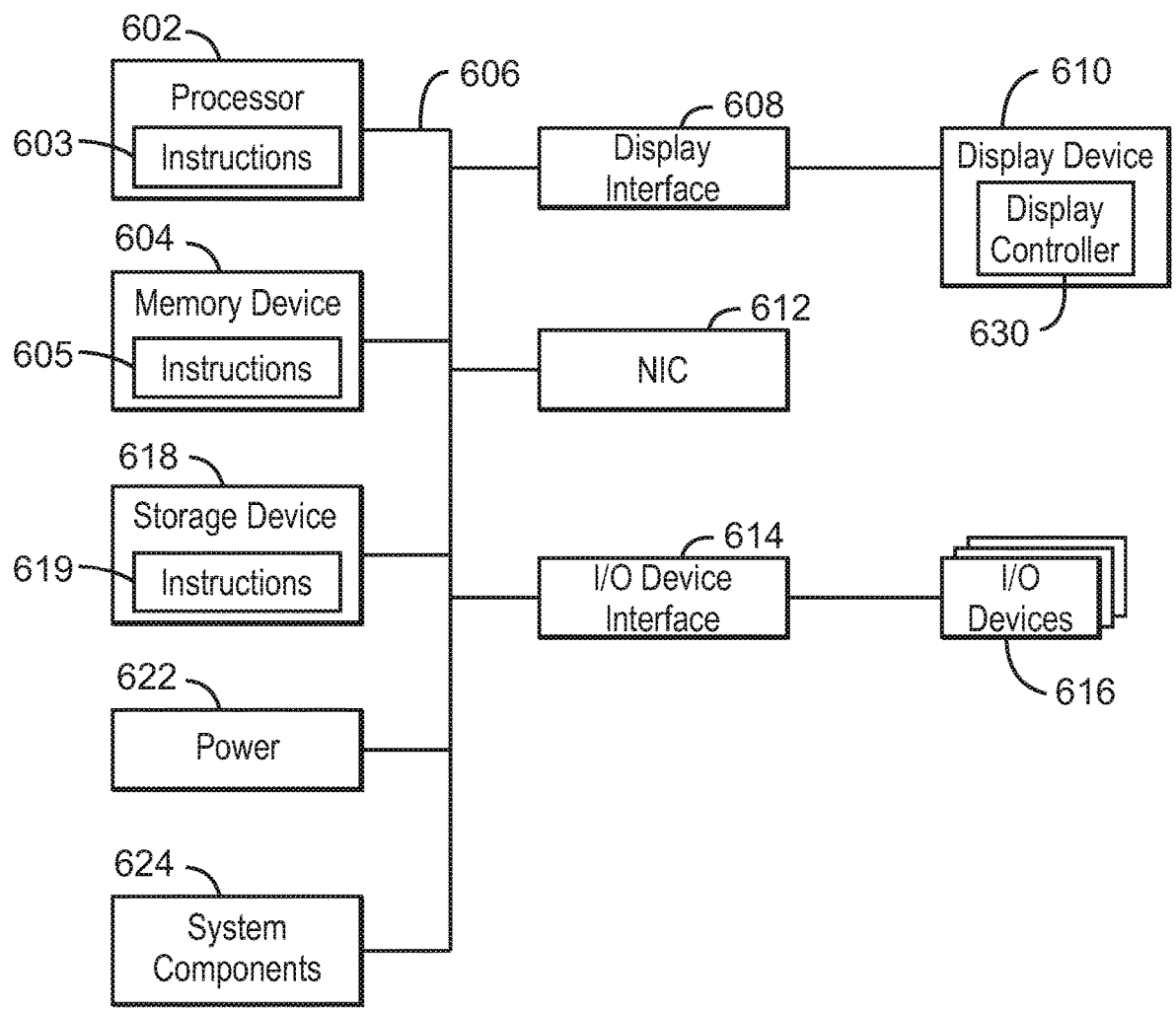
FIG. 6 illustrates a computing system in accordance with some embodiments.

FIG. 6 illustrates a computing system 600 in accordance with some embodiments. FIG. 6 is a block diagram of an example of a computing device 600 in accordance with some embodiments. In some embodiments, computing device 600 may be a computing device including one or more elements of circuit 100, one or more elements of circuit 300, and/or one or more elements of circuit 500, for example. In some embodiments, computing device 600 may contain pulsed latches. In some embodiments, one or more elements of computing device 600 can implement error detection, prediction, correction, repair, prevention, and/or avoidance of minimum delay (min-delay) errors for designs based on pulsed latches. In some embodiments, computing device 600 may provide any techniques or functions illustrated and/or described herein.

In some embodiments, any portion of the flow, circuits or systems illustrated in any one or more of the figures, and any of the embodiments described herein can be included in or be implemented by computing device 600. The computing device 600 may be, for example, a computing device, a controller, a control unit, an application specific controller, and/or an embedded controller, among others.

The computing device 600 may include a processor 602 that is adapted to execute stored instructions (for example, instructions 603), as well as a memory device 604 (or storage 604) that stores instructions 605 that are executable by the processor 602. In some embodiments, processor 602 may include some or all of the elements of circuit 100, circuit 300, and/or circuit 500. The processor 602 can be a single core processor, a multi-core processor, a computing cluster, or any number of other configurations. For example, processor 602 can be an Intel® processor such as an Intel® Celeron, Pentium, Core, Core i3, Core i5, or Core i7 processor. In some embodiments, processor 602 can be an Intel® x86 based processor. In some embodiments, processor 602 can be an ARM based processor. The memory device 604 can be a memory device or a storage device, and can include volatile storage, non-volatile storage, random access memory, read only memory, flash memory, or any other suitable memory or storage systems. The instructions that are executed by the processor 602 may also be used to implement any of the techniques as described in this specification and/or illustrated in the drawings. In some embodiments, processor 602 may include the same or similar features or functionality as, for example, various controllers or agents in this disclosure.

The processor 602 may also be linked through the system interconnect 606 (e.g., PCI®, PCI-Express®, NuBus, etc.) to a display interface 608 adapted to connect the computing device 600 to a display device 610. The display device 610 may include a display controller 630. Display device 610 may also include a display screen that is a built-in component of the computing device 600. The display device may also include a computer monitor, television, or projector, among others, that is externally connected to the computing device 600. In some embodiments, computing device 600 does not include a display interface or a display device.

In some embodiments, the display interface 608 can include any suitable graphics processing unit, transmitter, port, physical interconnect, and the like. In some examples, the display interface 608 can implement any suitable protocol for transmitting data to the display device 610. For example, the display interface 608 can transmit data using a high-definition multimedia interface (HDMI) protocol, a DisplayPort protocol, or some other protocol or communication link, and the like.

In addition, a network interface controller (also referred to herein as a NIC) 612 may be adapted to connect the computing device 600 through the system interconnect 606 to a network (not depicted). The network (not depicted) may be a wired network, a wireless network, a cellular network, a radio network, a wide area network (WAN), a local area network (LAN), and/or the Internet, among others.

The processor 602 may be connected through system interconnect 606 to an input/output (I/O) device interface 614 adapted to connect the computing host device 600 to one or more I/O devices 616. The I/O devices 616 may include, for example, a keyboard or a pointing device, where the pointing device may include a mouse, a touchpad, or a touchscreen, among others. The I/O devices 616 may be built-in components of the computing device 600, or may be devices that are externally connected to the computing device 600.

In some embodiments, the processor 602 may also be linked through the system interconnect 606 to a storage device 618 that can include a hard drive, a solid-state drive (SSD), a magnetic drive, an optical drive, a USB flash drive, an array of drives, or any other type of storage, including combinations thereof. In some embodiments, the storage device 618 can include any suitable applications that can be used by processor 602 to implement any of the techniques described herein. In some embodiments, storage 618 stores instructions 619 that are executable by the processor 602. In some embodiments, the storage device 618 can include a basic input/output system (BIOS).

In some embodiments, a power device 622 is provided. In some embodiments, power 622 can include one or more sources of power such as one or more power supply units (PSUs). In some embodiments, power 622 can be a part of system 600, and in some embodiments, power 622 can be external to the rest of system 600. In some embodiments, power 622 can provide any of the techniques described herein. For example, in some embodiments, power 622 can provide any of the techniques as described in reference to or illustrated in any of the drawings herein.

FIG. 6 also illustrates system components 624. In some embodiments, system components 624 can include any of display, camera, audio, storage, modem, or memory components, or any additional system components. In some embodiments, system components 624 can include any system components for which power, voltage, power management, etc. can be implemented according to some embodiments as described herein.

It is to be understood that the block diagram of FIG. 6 is not intended to indicate that the computing device 600 is to include all of the components shown in FIG. 6 in all embodiments. Rather, the computing device 600 can include fewer or additional components not illustrated in FIG. 6 (e.g., additional memory components, embedded controllers, additional modules, additional network interfaces, etc.).

Furthermore, any of the functionalities of power device 622 may be partially, or entirely, implemented in hardware or in a processor such as processor 602. For example, the functionality may be implemented with an application specific integrated circuit, logic implemented in an embedded controller, or in logic implemented in the processor 602, among others. In some embodiments, the functionalities of power device 622 can be implemented with logic, wherein the logic, as referred to herein, can include any suitable hardware (e.g., a processor, among others), software (e.g., an application, among others), firmware, or any suitable combination of hardware, software, or firmware. In some embodiments, power device 622 can be implemented with an integrated circuit.

Figure 7:
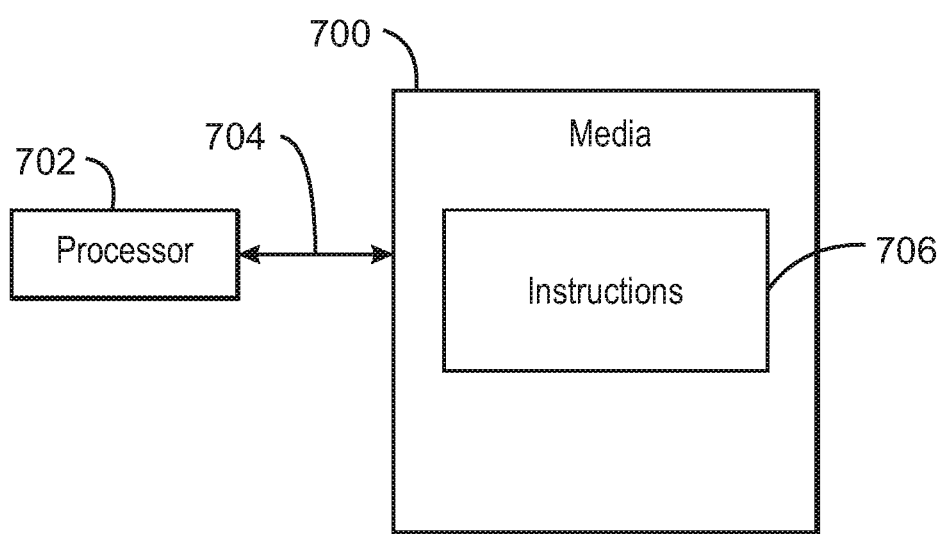
FIG. 7 illustrates one or more processors and one or more media in accordance with some embodiments.

FIG. 7 is a block diagram of an example of one or more processors 702 and one or more tangible, non-transitory computer readable media 700. The one or more tangible, non-transitory, computer-readable media 700 may be accessed by the processor(s) 702 over a computer interconnect 704. Furthermore, the one or more tangible, non-transitory, computer-readable media 700 may include instructions (or code) 706 to direct the processor(s) 702 to perform operations as described herein. In some embodiments, processor 702 is one or more processors. In some embodiments, processor(s) 702 can perform some or all of the same or similar functions that can be performed by other elements described herein using instructions (code) 706 included on media 700 (for example, some or all of the functions or techniques illustrated in or described in reference to any of FIGS. 1-6). In some embodiments, one or more of processor(s) 702 may include the same or similar features or functionality as, for example, various controllers, units, or agents, etc. described in this disclosure. In some embodiments, one or more processor(s) 702, interconnect 704, and/or media 700 may be included in computing device 600.

Various components discussed in this specification may be implemented using software components. These software components may be stored on the one or more tangible, non-transitory, computer-readable media 700, as indicated in FIG. 7. For example, instructions 706 may be adapted to direct the processor(s) 702 to perform one or more of any of the operations described in this specification and/or in reference to the drawings.

It is to be understood that any suitable number of software components may be included within the one or more tangible, non-transitory computer-readable media 700. Furthermore, any number of additional software components shown or not shown in FIG. 7 may be included within the one or more tangible, non-transitory, computer-readable media 700, depending on the specific application.

The various techniques and/or operations described herein (for example, in reference to any one or more of FIGS. 1-7) may be performed by a control unit comprised of one or more processors, monitoring logic, control logic, software, firmware, agents, controllers, logical software agents, system agents, and/or other modules. For example, in some embodiments, some or all of the techniques and/or operations described herein may be implemented by a system agent. Due to the variety of modules and their configurations that may be used to perform these functions, and their distribution through the system and/or in a different system, they are not all specifically illustrated in their possible locations in the figures.

Reference in the specification to "one embodiment" or "an embodiment" or "some embodiments" of the disclosed subject matter means that a particular feature, structure, or characteristic described in connection with the embodiment is included in at least one embodiment of the disclosed subject matter. Thus, the phrase "in one embodiment" or "in some embodiments" may appear in various places throughout the specification, but the phrase may not necessarily refer to the same embodiment or embodiments.

Example 1 In some examples, a minimum delay error apparatus includes a minimum delay path replica circuit to detect, predict, correct, repair, prevent, and/or avoid a minimum delay error in a data path of a digital circuit using pulsed latches. The minimum delay error apparatus may be a minimum delay error detection, prediction, correction, repair, prevention, and/or avoidance apparatus.

Example 2 includes the subject matter of example 1. The minimum delay path replica circuit is to replicate a respective portion of the data path of the digital circuit in order to replicate minimum delay timing in the data path.

Example 3 includes the subject matter of any of examples 1-2. The minimum delay path replica circuit (and/or a delay path of the minimum delay path replica circuit) is to be adjusted to be slightly shorter than a worst minimum delay path in an associated group of minimum delay paths in the data path of the digital circuit.

Example 4 includes the subject matter of any of examples 1-3. The minimum delay path replica circuit (and/or a delay path of the minimum delay path replica circuit) is to be slightly shorter than a worst minimum delay path in an associated group of maximum delay paths in the data path of the digital circuit.

Example 5 includes the subject matter of any of examples 1-4. The minimum delay path replica circuit (and/or a delay path of the minimum delay path replica circuit) is to be adjusted to be slightly shorter than a worst minimum delay path in an associated group of minimum delay paths and maximum delay paths in the data path of the digital circuit.

Example 6 includes the subject matter of any of examples 1-5. The minimum delay path replica circuit includes a launch pulsed latch, a short data path with configurable delay, and an error detector.

Example 7 includes the subject matter of any of examples 1-6. The minimum delay path replica circuit is to provide an error signal to trigger one or more minimum delay error repairs.

Example 8 includes the subject matter of any of examples 1-7. The one or more minimum delay error repairs include one or more of adjusting a clock buffer to delay a launch clock, adjusting a clock buffer to speed up a capture clock, increasing a supply voltage of a clock distribution circuit, increasing a global supply voltage, and/or reducing a pulse width (PW).

Example 9 includes the subject matter of any of examples 1-8. The minimum delay path replica circuit is to predict the minimum delay error, and after the prediction of the minimum delay error, data operation in the data path of the digital circuit continues with an increased delay of the clock buffer on the launch clock path, with a decreased delay of the clock buffer on the capture clock path, with an increased clock supply voltage, with an increased global supply voltage, and/or with shorter pulse width (PW).

Example 10 includes the subject matter of any of examples 1-9. The minimum delay path replica circuit is to detect the minimum delay error, and after the detection of the minimum delay error, the minimum delay error is corrected.

Example 11 includes the subject matter of any of examples 1-10. The minimum delay error is corrected by stopping operation of the data path and replaying the operation of the data path.

Example 12 includes the subject matter of any of examples 1-11. The minimum delay error is corrected by replaying the operation of the data path with an increased delay of the clock buffer on the launch clock path, with a decreased delay of the clock buffer on the capture clock path, with an increased clock supply voltage, with an increased global supply voltage, and/or with shorter pulse width (PW).

Example 13 includes the subject matter of any of examples 1-12. The minimum delay path replica circuit includes an error detector. The apparatus includes a pulse generator to pulse functional latches and to enable minimum delay error detection by providing a signal to be sampled by the error detector.

Example 14 includes the subject matter of any of examples 1-13. The apparatus includes a clock distribution network including a plurality of clock branches, each of the clock branches including a global clock buffer and a pulse generator.

Example 15 includes the subject matter of any of examples 1-14. The global clock buffer is tunable.

Example 16 includes the subject matter of any of examples 1-15. The global clock buffer may be adjusted to correct for minimum delay errors in response to an error signal from the minimum delay path replica circuit.

Example 17 includes the subject matter of any of examples 1-16. The global clock buffer includes post-silicon tunable (PST) coarse and fine buffers.

Example 18 includes the subject matter of any of examples 1-17. The pulse generator is to enable detection and/or correction of minimum delay errors for designs based on pulsed latches by providing a signal to be sampled by an error detector of the minimum delay path replica circuit.

Example 19 includes the subject matter of any of examples 1-18. The digital circuit includes one or more of a processor, a central processing unit, a graphics processing unit, or a system on a chip.

Example 20 In some examples, a minimum delay error method includes detecting, predicting, correcting, repairing, preventing, and/or avoiding a minimum delay error in a data path of a digital circuit using pulsed latches.

Example 21 includes the subject matter of example 20. The method includes replicating a respective portion of the data path of the digital circuit in order to replicate minimum delay timing in the data path.

Example 22 includes the subject matter of any of examples 20-21. The method includes adjusting a delay path replica (and/or a delay path of a delay path replica) to be slightly shorter than a worst minimum delay path in an associated group of minimum delay paths in the data path of the digital circuit.

Example 23 includes the subject matter of any of examples 20-22. The method includes adjusting a delay path replica (and/or a delay path of a delay path replica) to be slightly shorter than a worst minimum delay path in an associated group of maximum delay paths in the data path of the digital circuit.

Example 24 includes the subject matter of any of examples 20-23. The method includes adjusting a delay path replica (and/or a delay path of a delay path replica) to be slightly shorter than a worst minimum delay path in an associated group of minimum delay paths and maximum delay paths in the data path of the digital circuit.

Example 25 includes the subject matter of any of examples 20-24. The method includes using a minimum delay path replica circuit including a launch pulsed latch, a short data path with configurable delay, and an error detector to detect or predict a minimum delay error in a data path of a digital circuit using pulsed latches.

Example 26 includes the subject matter of any of examples 20-25. The method includes providing an error signal to trigger one or more minimum delay error repairs.

Example 27 includes the subject matter of any of examples 20-26. The method includes, in response to the error signal, one or more of adjusting a clock buffer to delay a launch clock, adjusting a clock buffer to speed up a capture clock, increasing a supply voltage of a clock distribution circuit, increasing global supply voltage, and/or reducing a pulse width (PW).

Example 28 includes the subject matter of any of examples 20-27. The method includes predicting the minimum delay error, and, after the prediction of the minimum delay error, continuing data operation in the data path of the digital circuit with an increased delay of the clock buffer on the launch clock path, with a decreased delay of the clock buffer on the capture clock path, with an increased clock supply voltage, with an increased global supply voltage, and/or with shorter pulse width (PW).

Example 29 includes the subject matter of any of examples 20-28. The method includes detecting the minimum delay error, and, after the detection of the minimum delay error, correcting the minimum delay error.

Example 30 includes the subject matter of any of examples 20-29. The method includes correcting the minimum delay error by stopping operation of the data path and replaying the operation of the data path.

Example 31 includes the subject matter of any of examples 20-30. The method include replaying the operation of the data path with an increased delay of the clock buffer on the launch clock path, with a decreased delay of the clock buffer on the capture clock path, with an increased clock supply voltage, with an increased global supply voltage, and/or with shorter pulse width (PW).

Example 32 includes the subject matter of any of examples 20-31. The method includes pulsing functional latches, and enabling minimum delay error detection by providing a signal to be sampled by a minimum delay error detector.

Example 33 includes the subject matter of any of examples 20-32. The method includes clocking the digital circuit with clock branches including a global clock buffer and a pulse generator.

Example 34 includes the subject matter of any of examples 20-33. The method includes tuning the global clock buffer.

Example 35 includes the subject matter of any of examples 20-34. The method includes adjusting the global clock buffer to correct for minimum delay errors in response to an error signal.

Example 36 includes the subject matter of any of examples 20-35. The global clock buffer includes post-silicon tunable (PST) coarse and fine buffers.

Example 37 includes the subject matter of any of examples 20-36. The method includes enabling detection and/or correction of minimum delay errors by providing a pulse signal to sample an error detector.

Example 38 includes the subject matter of any of examples 20-37. The digital circuit includes one or more of a processor, a central processing unit, a graphics processing unit, or a system on a chip.

Example 39 In some examples, a minimum delay error apparatus includes means for detecting, predicting, correcting, repairing, preventing, and/or avoiding a minimum delay error in a data path of a digital circuit using pulsed latches.

Example 40 includes the subject matter of example 39. The apparatus includes means for replicating a respective portion of the data path of the digital circuit in order to replicate minimum delay timing in the data path.

Example 41 includes the subject matter of any of examples 39-40. The apparatus includes means for adjusting a delay path replica (and/or a delay path of a minimum delay path replica) to be slightly shorter than a worst minimum delay path in an associated group of minimum delay paths in the data path of the digital circuit.

Example 42 includes the subject matter of any of examples 39-41. The apparatus includes means for adjusting a delay path replica (and/or a delay path of a delay path replica) to be slightly shorter than a worst minimum delay path in an associated group of maximum delay paths in the data path of the digital circuit.

Example 43 includes the subject matter of any of examples 39-42. The apparatus includes means for adjusting a delay path replica (and/or a delay path of a delay path replica) to be slightly shorter than a worst minimum delay path in an associated group of minimum delay paths and maximum delay paths in the data path of the digital circuit.

Example 44 includes the subject matter of any of examples 39-43. The apparatus includes means for using a minimum delay path replica circuit including a launch pulsed latch, a short data path with configurable delay, and an error detector to detect or predict a minimum delay error in a data path of a digital circuit using pulsed latches.

Example 45 includes the subject matter of any of examples 39-44. The apparatus includes means for providing an error signal to trigger one or more minimum delay error repairs.

Example 46 includes the subject matter of any of examples 39-45. The apparatus includes, in response to the error signal, one or more of means for adjusting a clock buffer to delay a launch clock, means for adjusting a clock buffer to speed up a capture clock, means for increasing a supply voltage of a clock distribution circuit, means for increasing a global supply voltage, and/or means for reducing a pulse width (PW).

Example 47 includes the subject matter of any of examples 39-46. The apparatus includes means for predicting the minimum delay error, and, means for continuing, after the prediction of the minimum delay error, data operation in the data path of the digital circuit with an increased delay of the clock buffer on the launch clock path, with a decreased delay of the clock buffer on the capture clock path, with an increased clock supply voltage, with an increased global supply voltage, and/or with shorter pulse width (PW).

Example 48 includes the subject matter of any of examples 39-47. The apparatus includes means for detecting the minimum delay error, and, means for correcting the minimum delay error after the detection of the minimum delay error.

Example 49 includes the subject matter of any of examples 39-48. The apparatus includes means for correcting the minimum delay error by stopping operation of the data path and replaying the operation of the data path.

Example 50 includes the subject matter of any of examples 39-49. The apparatus includes means for correcting the minimum delay error by replaying the operation of the data path with an increased delay of the clock buffer on the launch clock path, with a decreased delay of the clock buffer on the capture clock path, with an increased clock supply voltage, with an increased global supply voltage, and/or with shorter pulse width (PW).

Example 51 includes the subject matter of any of examples 39-50. The apparatus includes means for pulsing functional latches, and means for enabling minimum delay error detection by providing a signal which is to be sampled by a minimum delay error detector.

Example 52 includes the subject matter of any of examples 39-51. The apparatus includes means for clocking the digital circuit with clock branches including a global clock buffer means and a pulse generator means.

Example 53 includes the subject matter of any of examples 39-52. The apparatus includes means for tuning the global clock buffer.

Example 54 includes the subject matter of any of examples 39-53. The apparatus includes means for adjusting the global clock buffer to correct for minimum delay errors in response to an error signal.

Example 55 includes the subject matter of any of examples 39-54. The global clock buffer includes post-silicon tunable (PST) means for coarse and fine tuning.

Example 56 includes the subject matter of any of examples 39-55. The apparatus include means for enabling detection and/or correction of minimum delay errors or designs based on pulsed latches by providing a signal to be sampled by an error detector.

Example 57 includes the subject matter of any of examples 39-56. The minimum delay error detection apparatus is included in one or more of a processor, a central processing unit, a graphics processing unit, or a system on a chip.

Example 58 In some examples, one or more tangible, non-transitory machine readable medium includes a plurality of instructions that, in response to being executed on at least one processor, cause the at least one processor to detect, predict, correct, repair, prevent, and/or avoid a minimum delay error in a data path of a digital circuit using pulsed latches.

Example 59 includes the subject matter of example 58. The one or more tangible, non-transitory machine readable medium includes a plurality of instructions that, in response to being executed on at least one processor, cause the at least one processor to replicate a respective portion of the data path of the digital circuit in order to replicate minimum delay timing in the data path.

Example 60 includes the subject matter of any of examples 58-59. The one or more tangible, non-transitory machine readable medium includes a plurality of instructions that, in response to being executed on at least one processor, cause the at least one processor to adjust a delay path replica (and/or a delay path of a delay path replica) to be slightly shorter than a worst minimum delay path in an associated group of minimum delay paths in the data path of the digital circuit.

Example 61 includes the subject matter of any of examples 58-60. The one or more tangible, non-transitory machine readable medium includes a plurality of instructions that, in response to being executed on at least one processor, cause the at least one processor to adjust a delay path replica (and/or a delay path of a delay path replica) to be slightly shorter than a worst minimum delay path in an associated group of maximum delay paths in the data path of the digital circuit.

Example 62 includes the subject matter of any of examples 58-61. The one or more tangible, non-transitory machine readable medium includes a plurality of instructions that, in response to being executed on at least one processor, cause the at least one processor to adjust a delay path replica (and/or a delay path of a delay path replica) to be slightly shorter than a worst minimum delay path in an associated group of minimum delay paths and maximum delay paths in the data path of the digital circuit.

Example 63 includes the subject matter of any of examples 58-62. The one or more tangible, non-transitory machine readable medium includes a plurality of instructions that, in response to being executed on at least one processor, cause the at least one processor to use a minimum delay path replica circuit including a launch pulsed latch, a short data path with configurable delay, and an error detector to detect or predict a minimum delay error in a data path of a digital circuit using pulsed latches.

Example 64 includes the subject matter of any of examples 58-63. The one or more tangible, non-transitory machine readable medium includes a plurality of instructions that, in response to being executed on at least one processor, cause the at least one processor to provide an error signal to trigger one or more minimum delay error repairs.

Example 65 includes the subject matter of any of examples 58-64. The one or more tangible, non-transitory machine readable medium includes a plurality of instructions that, in response to being executed on at least one processor, cause the at least one processor to, in response to the error signal, one or more of adjust a clock buffer to delay a launch clock, adjust a clock buffer to speed up a capture clock, increase a supply voltage of a clock distribution circuit, increase a global supply voltage, and/or reduce a pulse width (PW).

Example 66 includes the subject matter of any of examples 58-65. The one or more tangible, non-transitory machine readable medium includes a plurality of instructions that, in response to being executed on at least one processor, cause the at least one processor to predict the minimum delay error, and after the prediction of the minimum delay error, to continue data operation in the data path of the digital circuit with an increased delay of the clock buffer on the launch clock path, with a decreased delay of the clock buffer on the capture clock path, with an increased clock supply voltage, with an increased global supply voltage, and/or with shorter pulse width (PW).

Example 67 includes the subject matter of any of examples 58-66. The one or more tangible, non-transitory machine readable medium includes a plurality of instructions that, in response to being executed on at least one processor, cause the at least one processor to detect the minimum delay error, and after the detection of the minimum delay error, correct the minimum delay error.

Example 68 includes the subject matter of any of examples 58-67. The one or more tangible, non-transitory machine readable medium includes a plurality of instructions that, in response to being executed on at least one processor, cause the at least one processor to correct the minimum delay error by stopping operation of the data path and replaying the operation of the data path.

Example 69 includes the subject matter of any of examples 58-68. The one or more tangible, non-transitory machine readable medium includes a plurality of instructions that, in response to being executed on at least one processor, cause the at least one processor to replay the operation of the data path with an increased delay of the clock buffer on the launch clock path, with a decreased delay of the clock buffer on the capture clock path, with an increased clock supply voltage, with an increased global supply voltage, and/or with shorter pulse width (PW).

Example 70 includes the subject matter of any of examples 58-69. The one or more tangible, non-transitory machine readable medium includes a plurality of instructions that, in response to being executed on at least one processor, cause the at least one processor to pulse functional latches, and enable minimum delay error detection by providing a signal which is to be sampled by a minimum delay error detector.

Example 71 includes the subject matter of any of examples 58-70. The one or more tangible, non-transitory machine readable medium includes a plurality of instructions that, in response to being executed on at least one processor, cause the at least one processor to clock the digital circuit with clock branches including a global clock buffer and a pulse generator.

Example 72 includes the subject matter of any of examples 58-71. The one or more tangible, non-transitory machine readable medium includes a plurality of instructions that, in response to being executed on at least one processor, cause the at least one processor to tune the global clock buffer.

Example 73 includes the subject matter of any of examples 58-72. The one or more tangible, non-transitory machine readable medium includes a plurality of instructions that, in response to being executed on at least one processor, cause the at least one processor to adjust the global clock buffer to correct for minimum delay errors in response to an error signal.

Example 74 includes the subject matter of any of examples 58-73. The global clock buffer includes post-silicon tunable (PST) coarse and fine buffers.

Example 75 includes the subject matter of any of examples 58-74. The one or more tangible, non-transitory machine readable medium includes a plurality of instructions that, in response to being executed on at least one processor, cause the at least one processor to enable detection and/or correction of minimum delay errors for designs based on pulsed latches by providing a pulse signal to be sampled by an error detector.

Example 76 includes the subject matter of any of examples 58-75. The digital circuit includes one or more of a processor, a central processing unit, a graphics processing unit, or a system on a chip.

Example 77 In some examples, a minimum delay error system includes a digital circuit including a data path, the digital circuit using pulsed latches, and a minimum delay path replica circuit to detect, predict, correct, repair, prevent, and/or avoid a minimum delay error in the data path of the digital circuit.

Example 78 includes the subject matter of example 77. The minimum delay path replica circuit is to replicate a respective portion of the data path of the digital circuit in order to replicate minimum delay error timing in the data path.

Example 79 includes the subject matter of any of examples 77-78. The minimum delay path replica circuit (and/or a minimum delay path in the minimum delay path replica circuit) is to be adjusted to be slightly shorter than a worst minimum delay path in an associated group of minimum delay paths in the data path of the digital circuit.

Example 80 includes the subject matter of any of examples 77-79. The minimum delay path replica circuit (and/or a minimum delay path in the minimum delay path replica circuit) is to be adjusted to be slightly shorter than a worst minimum delay path in an associated group of maximum delay paths in the data path of the digital circuit.

Example 81 includes the subject matter of any of examples 77-80. The minimum delay path replica circuit (and/or a minimum delay path in the minimum delay path replica circuit) is to be adjusted to be slightly shorter than a worst minimum delay path in an associated group of minimum delay paths and maximum delay paths in the data path of the digital circuit.

Example 82 includes the subject matter of any of examples 77-81. The minimum delay path replica circuit includes a launch pulsed latch, a short data path with configurable delay, and an error detector.

Example 83 includes the subject matter of any of examples 77-82. The minimum delay path replica circuit is to provide an error signal to trigger one or more minimum delay error repairs.

Example 84 includes the subject matter of any of examples 77-83. The one or more minimum delay error repairs include one or more of adjusting a clock buffer to delay a launch clock, adjusting a clock buffer to speed up a capture clock, increasing a supply voltage of a clock distribution circuit, increasing a global supply voltage, and/or reducing a pulse width (PW).

Example 85 includes the subject matter of any of examples 77-84. The minimum delay path replica circuit is to predict the minimum delay error, and after the prediction of the minimum delay error, data operation in the data path of the digital circuit continues with an increased delay of the clock buffer on the launch clock path, with a decreased delay of the clock buffer on the capture clock path, with an increased clock supply voltage, with an increased global supply voltage, and/or with shorter pulse width (PW).

Example 86 includes the subject matter of any of examples 77-85. The minimum delay path replica circuit is to detect the minimum delay error, and after the detection of the minimum delay error, to correct the minimum delay error is corrected.

Example 87 includes the subject matter of any of examples 77-86. The minimum delay error is to be corrected by stopping operation of the data path and replaying the operation of the data path at an increased supply voltage.

Example 88 includes the subject matter of any of examples 77-87. The minimum delay error is to be corrected by replaying the operation of the data path with an increased delay of the clock buffer on the launch clock path, with a decreased delay of the clock buffer on the capture clock path, with an increased clock supply voltage, with an increased global supply voltage, and/or with shorter pulse width (PW).

Example 89 includes the subject matter of any of examples 77-88. The minimum delay path replica circuit includes an error detector, and the system includes a pulse generator to pulse functional latches and to enable minimum delay error detection by providing a signal which is to be sampled by the error detector.

Example 90 includes the subject matter of any of examples 77-89. The system includes a clock distribution network including a plurality of clock branches. Each of the clock branches includes a global clock buffer and a pulse generator.

Example 91 includes the subject matter of any of examples 77-90. The global clock buffer is tunable.

Example 92 includes the subject matter of any of examples 77-91. The global clock buffer may be adjusted to correct for minimum delay errors in response to an error signal from the minimum delay path replica circuit.

Example 93 includes the subject matter of any of examples 77-92. The global clock buffer includes post-silicon tunable (PST) coarse and fine buffers.

Example 94 includes the subject matter of any of examples 77-93. The pulse generator is to enable detection and/or correction of minimum delay errors for designs based on pulsed latches by providing a signal to be sampled by an error detector of the minimum delay path replica circuit.

Example 95 includes the subject matter of any of examples 77-94. The system includes (and/or is included in) one or more of a processor, a central processing unit, a graphics processing unit, or a system on a chip.

Example 96 In some examples, an apparatus includes means to perform a method as in any other example.

Example 97 In some examples, a system includes means to perform a method as in any other claim.

Example 98 In some examples, machine-readable storage includes machine-readable instructions, when executed, to implement a method or realize an apparatus as in any other example.

Example 99 In some examples, one or more machine readable medium include(s) code, when executed, to cause a machine to perform the method of any other example.

Although example embodiments and examples of the disclosed subject matter are described with reference to circuit diagrams, flow diagrams, block diagrams etc. in the drawings, persons of ordinary skill in the art will readily appreciate that many other ways of implementing the disclosed subject matter may alternatively be used. For example, the arrangements of the elements in the diagrams, or the order of execution of the blocks in the diagrams may be changed, or some of the circuit elements in circuit diagrams, and blocks in block/flow diagrams described may be changed, eliminated, or combined. Any elements as illustrated or described may be changed, eliminated, or combined.

In the preceding description, various aspects of the disclosed subject matter have been described. For purposes of explanation, specific numbers, systems and configurations were set forth in order to provide a thorough understanding of the subject matter. However, it is apparent to one skilled in the art having the benefit of this disclosure that the subject matter may be practiced without the specific details. In other instances, well-known features, components, or modules were omitted, simplified, combined, or split in order not to obscure the disclosed subject matter.

Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

Program code may represent hardware using a hardware description language or another functional description language which essentially provides a model of how designed hardware is expected to perform. Program code may be assembly or machine language or hardware-definition languages, or data that may be compiled or interpreted. Furthermore, it is common in the art to speak of software, in one form or another as taking an action or causing a result. Such expressions are merely a shorthand way of stating execution of program code by a processing system which causes a processor to perform an action or produce a result.

Program code may be stored in, for example, one or more volatile or non-volatile memory devices, such as storage devices or an associated machine readable or machine accessible medium including solid-state memory, hard-drives, floppy-disks, optical storage, tapes, flash memory, memory sticks, digital video disks, digital versatile discs (DVDs), etc., as well as more exotic mediums such as machine-accessible biological state preserving storage. A machine readable medium may include any tangible mechanism for storing, transmitting, or receiving information in a form readable by a machine, such as antennas, optical fibers, communication interfaces, etc. Program code may be transmitted in the form of packets, serial data, parallel data, etc., and may be used in a compressed or encrypted format.

Program code may be implemented in programs executing on programmable machines such as mobile or stationary computers, personal digital assistants, set top boxes, cellular telephones and pagers, and other electronic devices, each including a processor, volatile or non-volatile memory readable by the processor, at least one input device or one or more output devices. Program code may be applied to the data entered using the input device to perform the described embodiments and to generate output information. The output information may be applied to one or more output devices. One of ordinary skill in the art may appreciate that embodiments of the disclosed subject matter can be practiced with various computer system configurations, including multiprocessor or multiple-core processor systems, minicomputers, mainframe computers, as well as pervasive or miniature computers or processors that may be embedded into virtually any device. Embodiments of the disclosed subject matter can also be practiced in distributed computing environments where tasks may be performed by remote processing devices that are linked through a communications network.

Although operations may be described as a sequential process, some of the operations may in fact be performed in parallel, concurrently, or in a distributed environment, and with program code stored locally or remotely for access by single or multi-processor machines. In addition, in some embodiments the order of operations may be rearranged without departing from the spirit of the disclosed subject matter. Program code may be used by or in conjunction with embedded controllers.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter. For example, in each illustrated embodiment and each described embodiment, it is to be understood that the diagrams of the figures and the description herein is not intended to indicate that the illustrated or described devices include all of the components shown in a particular figure or described in reference to a particular figure. In addition, each element may be implemented with logic, wherein the logic, as referred to herein, can include any suitable hardware (e.g., a processor, among others), software (e.g., an application, among others), firmware, or any suitable combination of hardware, software, and firmware, for example.

What is claimed is:

1. A minimum delay error apparatus comprising:
a minimum delay path replica circuit to detect, predict, correct, repair, prevent, and/or avoid a minimum delay error in a data path of a digital circuit using pulsed latches, wherein a data path of the minimum delay path replica circuit is shorter than a worst minimum delay path in an associated group of delay paths in the data path of the digital circuit.

2. The apparatus of claim 1, the minimum delay path replica circuit to replicate a respective portion of the data path of the digital circuit in order to replicate minimum delay timing in the data path.

3. The apparatus of claim 1, the minimum delay path replica circuit to be adjusted to be slightly shorter than a worst minimum delay path in an associated group of minimum delay paths in the data path of the digital circuit.

4. The apparatus of claim 1, the minimum delay path replica circuit including a launch pulsed latch, a short data path with configurable delay, and an error detector.

5. The apparatus of claim 1, the minimum delay path replica circuit to provide an error signal to trigger one or more minimum delay error repairs.

6. The apparatus of claim 5, the one or more minimum delay error repairs including one or more of adjusting a clock buffer to delay a launch clock, adjusting a clock buffer to speed up a capture clock, increasing a supply voltage of a clock distribution circuit, increasing a global supply voltage, and/or reducing a pulse width (PW).

7. The apparatus of claim 1, wherein the minimum delay path replica circuit is to predict the minimum delay error, and after the prediction of the minimum delay error, data operation in the data path of the digital circuit continues with an increased delay of the clock buffer on the launch clock path, with a decreased delay of the clock buffer on the capture clock path, with an increased clock supply voltage, with an increased global supply voltage, and/or with shorter pulse width (PW).

8. The apparatus of claim 1, wherein the minimum delay path replica circuit is to detect the minimum delay error, and after the detection of the minimum delay error, the minimum delay error is corrected.

9. The apparatus of claim 8, wherein the minimum delay error is corrected by stopping operation of the data path and replaying the operation of the data path.

10. The apparatus of claim 9, wherein the minimum delay error is corrected by replaying the operation of the data path with an increased delay of the clock buffer on the launch clock path, with a decreased delay of the clock buffer on the capture clock path, with an increased clock supply voltage, with an increased global supply voltage, and/or with shorter pulse width (PW).

11. The apparatus of claim 1, wherein the minimum delay path replica circuit includes an error detector, the apparatus comprising a pulse generator to pulse functional latches and to enable minimum delay error detection by providing a signal which is sampled by the error detector.

12. The apparatus of claim 1, comprising a clock distribution network including a plurality of clock branches, each of the clock branches including a global clock buffer and a pulse generator.

13. The apparatus of claim 12, wherein the global clock buffer is tunable.

14. The apparatus of claim 12, wherein the global clock buffer may be adjusted to correct for minimum delay errors in response to an error signal from the minimum delay path replica circuit.

15. The apparatus of claim 12, wherein the global clock buffer includes post-silicon tunable (PST) coarse and fine buffers.

16. The apparatus of claim 12, wherein the pulse generator is to enable detection and/or correction of minimum delay errors for designs based on pulsed latches by providing a signal to be sampled by an error detector of the minimum delay path replica circuit.

17. A minimum delay error apparatus comprising:
means for detecting, predicting, correcting, repairing, preventing, and/or avoiding a minimum delay error in a data path of a digital circuit using pulsed latches, wherein a delay path replica is shorter than a worst minimum delay path in an associated group of minimum delay paths in the data path of the digital circuit.

18. The apparatus of claim 17, comprising means for replicating a respective portion of the data path of the digital circuit in order to replicate minimum delay timing in the data path.

19. The apparatus of claim 17, comprising means for adjusting the delay path replica to be slightly shorter than the worst minimum delay path in the associated group of minimum delay paths in the data path of the digital circuit.

20. A minimum delay error system comprising:
a digital circuit including a data path, the digital circuit using pulsed latches; and
a minimum delay path replica circuit to detect, predict, correct, repair, prevent, and/or avoid a minimum delay error in the data path of the digital circuit, wherein a data path of the minimum delay path replica circuit is shorter than a worst minimum delay path in an associated group of delay paths in the data path of the digital circuit.

21. The system of claim 20, the minimum delay path replica circuit to replicate a respective portion of the data path of the digital circuit in order to replicate minimum delay error timing in the data path.

22. The system of claim 20, the minimum delay path replica circuit to be adjusted to be slightly shorter than a worst minimum delay path in an associated group of minimum delay paths in the data path of the digital circuit.

23. One or more tangible, non-transitory machine readable medium comprising a plurality of instructions that, in response to being executed on at least one processor, cause the at least one processor to:
detect, predict, correct, repair, prevent, and/or avoid a minimum delay error in a data path of a digital circuit using pulsed latches, wherein a delay path replica is shorter than a worst minimum delay path in an associated group of minimum delay paths in the data path of the digital circuit.

24. The one or more tangible, non-transitory machine readable medium of claim 23, comprising a plurality of instructions that, in response to being executed on at least one processor, cause the at least one processor to:
replicate a respective portion of the data path of the digital circuit in order to replicate minimum delay timing in the data path.

25. The one or more tangible, non-transitory machine readable medium of claim 23, comprising a plurality of instructions that, in response to being executed on at least one processor, cause the at least one processor to:
adjust the delay path replica to be slightly shorter than the worst minimum delay path in the associated group of minimum delay paths in the data path of the digital circuit.

* * * * *